United States Patent
Cronin et al.

(10) Patent No.: US 12,000,893 B2
(45) Date of Patent: Jun. 4, 2024

(54) FAULT DETECTION RESPONSE IN A ROBOT ARM

(71) Applicant: CMR SURGICAL LIMITED, Cambridge (GB)

(72) Inventors: Ivan Cronin, Cambridge (GB); Hamish Henderson, Cambridge (GB)

(73) Assignee: CMR SURGICAL LIMITED, Cambridge (GB)

( * ) Notice: Subject to any disclaimer, the term of this patent is extended or adjusted under 35 U.S.C. 154(b) by 0 days.

(21) Appl. No.: 17/768,067

(22) PCT Filed: Oct. 9, 2020

(86) PCT No.: PCT/GB2020/052529
§ 371 (c)(1),
(2) Date: Apr. 11, 2022

(87) PCT Pub. No.: WO2021/069926
PCT Pub. Date: Apr. 15, 2021

(65) Prior Publication Data
US 2024/0094295 A1 Mar. 21, 2024

(30) Foreign Application Priority Data
Oct. 11, 2019 (GB) .................................... 1914735

(51) Int. Cl.
*G01R 31/34* (2020.01)
*B25J 9/16* (2006.01)
(Continued)

(52) U.S. Cl.
CPC .......... *G01R 31/343* (2013.01); *B25J 9/1674* (2013.01)

(58) Field of Classification Search
CPC .. G01R 31/26; G01R 31/2607; G01R 31/343; G01R 19/00; G01B 7/14; B25J 9/1674
See application file for complete search history.

(56) References Cited

U.S. PATENT DOCUMENTS

| 4,874,997 | A | 10/1989 | Daggett et al. |
| 9,729,099 | B1 * | 8/2017 | Lovas ..................... H02P 23/07 |

(Continued)

FOREIGN PATENT DOCUMENTS

| EP | 1596491 A2 | 11/2005 |
| GB | 2552885 A | 2/2018 |

(Continued)

OTHER PUBLICATIONS

Indian Examination Report from corresponding Indian Application No. 202227021855 dated Sep. 21, 2022.
(Continued)

*Primary Examiner* — Neel D Shah
(74) *Attorney, Agent, or Firm* — Lando & Anastasi, LLP

(57) ABSTRACT

A method of testing a motor of a robot arm for a fault during a start-up procedure of the robot arm. The robot arm comprises a first link connected to a second link by a joint, the joint permitting the second link to move relative to the first link. The motor is for driving the joint and is a multiple-phase motor, each phase of the motor comprising a motor winding and a motor drive circuit for applying power to the motor winding from a power supply rail and for applying drive signals to the motor winding. The method comprises, in the following order: (i) driving the motor to a known state; (ii) connecting a first phase only of the motor to the power supply rail; (iii) driving a Pulse Width Modulation (PWM) signal through the motor drive circuit of the first phase of the motor; (iv) driving the motor to a known state; (v) with the first phase of the motor disconnected from the power supply rail, driving the PWM signal through the motor drive circuit of the first phase of the motor; and (vi) repeating steps (ii) to (v) for each of the other phases of the motor; the method further comprising, during each of steps (Continued)

(i) to (vi), testing whether the current from the power supply rail to the motor drive circuit exceeds a current limit.

20 Claims, 7 Drawing Sheets

(51) Int. Cl.
*G01B 7/14* (2006.01)
*G01R 19/00* (2006.01)
*G01R 31/26* (2020.01)

(56) References Cited

U.S. PATENT DOCUMENTS

| | | |
|---|---|---|
| 2010/0063601 A1 | 3/2010 | Sankai |
| 2013/0307448 A1 | 11/2013 | Ikemoto et al. |
| 2013/0314014 A1 | 11/2013 | Tremel et al. |
| 2014/0306640 A1 | 10/2014 | Yamamoto |
| 2019/0099180 A1 | 4/2019 | Leimbach et al. |

FOREIGN PATENT DOCUMENTS

| | | |
|---|---|---|
| JP | 2015089294 A | 5/2015 |
| JP | 2016146184 A | 8/2016 |
| JP | 2016201922 A | 12/2016 |
| WO | 2010122861 A1 | 10/2010 |
| WO | 2015136918 A1 | 9/2015 |
| WO | 2019053974 A1 | 3/2019 |

OTHER PUBLICATIONS

Japanese Notification of Reasons for Refusal from corresponding Japanese Application No. 2021-531648 dated Dec. 21, 2021.
Notification of Transmittal of the International Search Report and the Written Opinion of the International Searching Authority from corresponding PCT/GB2020/052529 dated Jan. 29, 2021.
United Kingdom Search Report from corresponding United Kingdom Application No. GB1914735.4 dated Apr. 14, 2020.

* cited by examiner

FAULT DETECTION RESPONSE IN A ROBOT ARM

CROSS-REFERENCE TO RELATED APPLICATIONS

This application is a U.S. National Phase Application under 35 U.S.C. § 371 of International Application No. PCT/GB2020/052529, filed Oct. 9, 2020, which claims priority to United Kingdom Application No. 1914735.4, filed Oct. 11, 2019. Each application referenced above is hereby incorporated by reference in its entirety for all purposes.

FIELD OF THE INVENTION

This invention relates to controlling robot arms, and in particular to detecting and responding to faults in robot arms.

BACKGROUND

FIG. 1 illustrates a typical robot 100 for performing an operation. The robot 100 consists of a base 101, a robot arm 102, and an instrument 103. The base 101 supports the robot, and is itself attached rigidly to, for example, the floor, ceiling or a cart. The robot arm 102 extends between the base and the instrument. The robot arm consists of rigid links 104 interspersed with flexible joints 105. The robot arm is thereby articulated and able to move its distal end, and hence the instrument, within a workspace. The instrument comprises a shaft 106 and an end effector 107. The end effector 107 is located at a most distal position of the instrument from the robot arm. The end effector engages in the operation that the robot is undertaking. For example, the robot may be an industrial robot in a car manufacturing plant for performing operations on cars. As another example, the robot may be a surgical robot for assisting or performing surgery.

Each of the joints 105 of the robot arm is driven by a motor. In response to detection of a fault in the robot arm, it may be desirable to hold the robot arm in position whilst the fault is assessed. It is known to do this by applying a mechanical brake to each motor in the robot arm. However, incorporating a mechanical brake into the drive train of each motor increases the weight of the robot arm and takes up space within the robot arm. A lower weight, more compact solution is needed.

SUMMARY OF THE INVENTION

According to a first aspect, there is provided a method of testing a motor of a robot arm for a fault during a start-up procedure of the robot arm, the robot arm comprising a first link connected to a second link by a joint, the joint permitting the second link to move relative to the first link, the motor for driving the joint, the motor being a multiple-phase motor, each phase of the motor comprising a motor winding and a motor drive circuit for applying power to the motor winding from a power supply rail and for applying drive signals to the motor winding, the method comprising, in the following order: (i) driving the motor to a known state; (ii) connecting a first phase only of the motor to the power supply rail; (iii) driving a Pulse Width Modulation (PWM) signal through the motor drive circuit of the first phase of the motor; (iv) driving the motor to a known state; (v) with the first phase of the motor disconnected from the power supply rail, driving the PWM signal through the motor drive circuit of the first phase of the motor; and (vi) repeating steps (ii) to (v) for each of the other phases of the motor; the method further comprising, during each of steps (i) to (vi), testing whether the current from the power supply rail to the motor drive circuit exceeds a current limit.

The method may further comprise during each of steps (i) to (vi), testing whether the voltage supplied to the motor winding of the first phase of the motor differs from each of the power supply rail voltage and ground by more than respective values.

For each phase of the motor, the motor may comprise a load switch for connecting the power supply rail to the motor drive circuit of that phase, and each motor drive circuit may comprise a high side transistor and a low side transistor for driving the PWM signal to the motor winding of that phase, wherein step (i) and/or (iv) may comprise opening the load switch of every phase of the motor and turning on the low side transistor of every phase of the motor.

For each phase of the motor, the motor may comprise a load switch for connecting the power supply rail to the motor drive circuit of that phase, wherein step (ii) may comprise closing the load switch of the first phase of the motor with the load switches of all the other phases of the motor being open.

For each phase of the motor, the motor may comprise a load switch for connecting the power supply rail to the motor drive circuit of that phase, wherein step (v) may comprise with all load switches of every phase of the motor being open, driving the PWM signal through the motor drive circuit of the first phase of the motor.

The testing step may comprise comparing the voltage supplied to the winding to a high threshold during a high pulse of the PWM signal, and comparing the voltage supplied to the winding to a low threshold during a low pulse of the PWM signal.

The method may comprise detecting a fault if the voltage supplied to the winding is below the high threshold and/or detecting a fault if the voltage supplied to the winding is above the low threshold.

For each phase of the motor, the motor may comprise a load switch for connecting the power supply rail to the motor drive circuit of that phase, and a current sensor between the load switch and the motor drive circuit, and the method may comprise detecting a fault in response to sensing at the current sensor that the current from the power supply rail to the motor drive circuit exceeds a current limit.

Power may be applied to the power supply rail from one of a plurality of power supplies, and the method may comprise comparing the voltage supplied at a time t to a threshold voltage value for the time t.

The method may comprise detecting a fault if the supplied voltage at the time t is lower than the threshold voltage value for the time t.

Each motor drive circuit may comprise a high side transistor and a low side transistor for driving the PWM signal to the motor winding of that phase, and the method may comprise detecting a fault with the high side transistor if the voltage supplied to the winding is below the high threshold and/or detecting a fault with the low side transistor if the voltage supplied to the winding is above the low threshold.

For each phase of the motor, the motor may comprise a load switch for connecting the power supply rail to the motor drive circuit of that phase, and the method may comprise detecting a fault with the load switch of the first phase if, after a predetermined period of driving the PWM signal at step (v) of claim 1, the voltage supplied to the winding is above the high threshold.

Each motor drive circuit may comprise a high side transistor and a low side transistor for driving the PWM signal to the motor winding of that phase, and the method may comprise detecting a fault with the load switch of the first phase and/or the high side transistor and/or the low side transistor on sensing that the current from the power supply rail to the motor drive circuit exceeds a current limit.

The method may comprise detecting a fault with a power supply on sensing that the voltage from that power supply at time t drops below the threshold voltage value for the time t.

The method may comprise in response to detecting the fault, applying a braking current to the motor so as to maintain the position of the joint against gravity.

The method may comprise applying the braking current between a first pair of phases of the motor only, from the first phase of the first pair to the second phase of the first pair.

The method may further comprise, if a fault continues to be detected after a predetermined time period, applying a braking current between a second pair of phases of the motor only, from the first phase of the second pair to the second phase of the second pair.

The method may further comprise, if a fault continues to be detected after a predetermined time period, applying a braking current between a third pair of phases of the motor only, from the first phase of the third pair to the second phase of the third pair.

The method may further comprise, if a fault continues to be detected after a predetermined time period, applying a braking current between the first pair of phases of the motor only, from the second phase of the first pair to the first phase of the first pair.

The method may further comprise, if a fault continues to be detected after a predetermined time period, applying a braking current between the second pair of phases of the motor only, from the second phase of the second pair to the first phase of the second pair.

The method may further comprise, if a fault continues to be detected after a predetermined time period, applying a braking current between the third pair of phases of the motor only, from the second phase of the third pair to the first phase of the third pair.

BRIEF DESCRIPTION OF THE FIGURES

The present invention will now be described by way of example with reference to the accompanying drawings. In the drawings.

DETAILED DESCRIPTION

Figure 1:
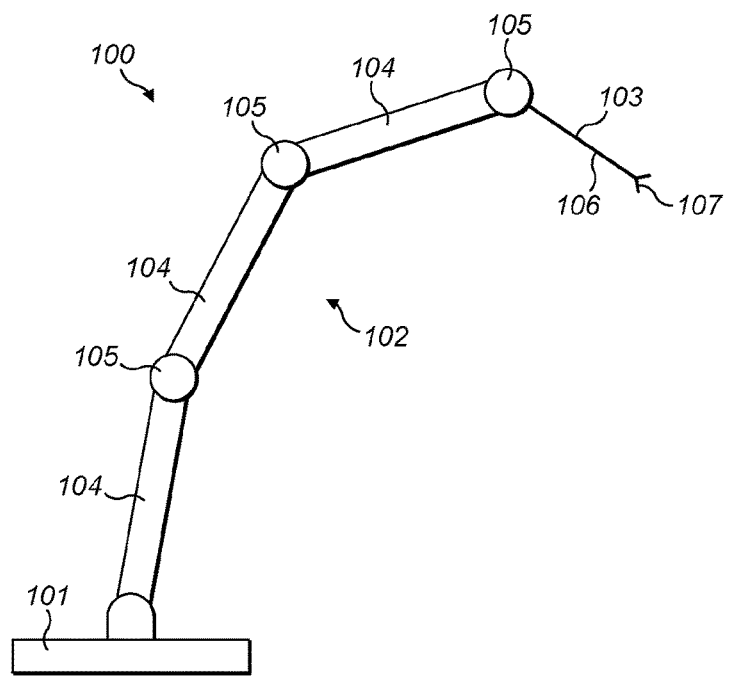
FIG. 1 illustrates a known robot arm.
Figure 2:
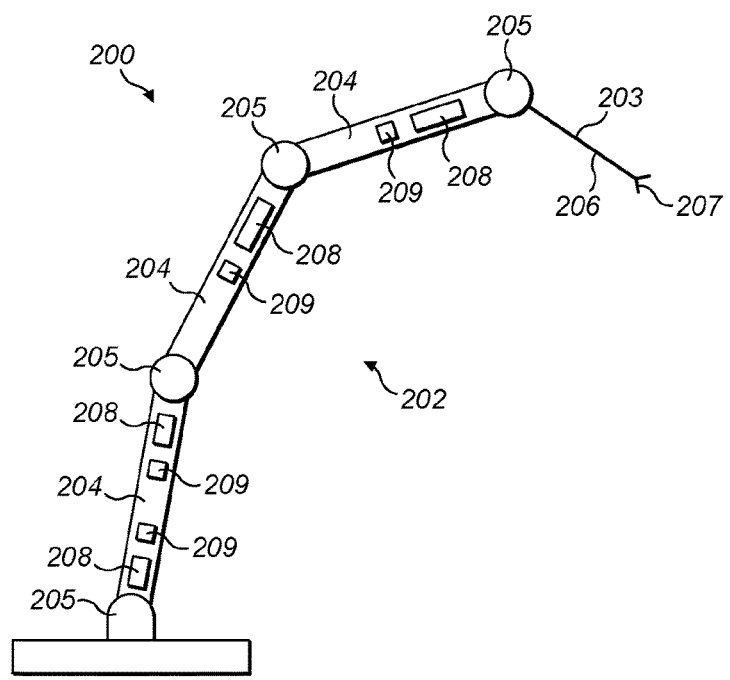
FIG. 2 illustrates an articulated robot arm.

The following disclosure relates to controlling a robot 200 of the type illustrated in FIG. 2. The robot consists of a robot arm 202 connected at one end to a base 201 and at the other to an instrument 203. The robot arm 202 comprises a series of links 204 interspersed with flexible joints 205. Each flexible joint permits the links it connects to move relative to each other. The flexible joints may comprise revolute joints, each of which permits the links it connects to rotate relative to each other about an axis. The flexible joints may comprise telescopic joints, each of which permits the links it connects to extend relative to each other along an axis. The instrument 203 comprises a shaft 206 and an end effector 207 for performing an operation.

Each joint is driven by a motor 208. A joint controller 209 controls the motor to drive the joint. Each joint in the robot arm may be driven by a separate motor. Suitably, that motor is located proximal to the joint. For example, of the two links that a joint connects, the motor may be located on the link which is most proximal to the base of the robot arm. However, in some circumstances, the motor may be located on the link which is most distal to the base of the robot arm. Each joint motor may have a dedicated joint controller for controlling the motor. Alternatively, a joint controller may control two or more joint motors.

Figure 3:
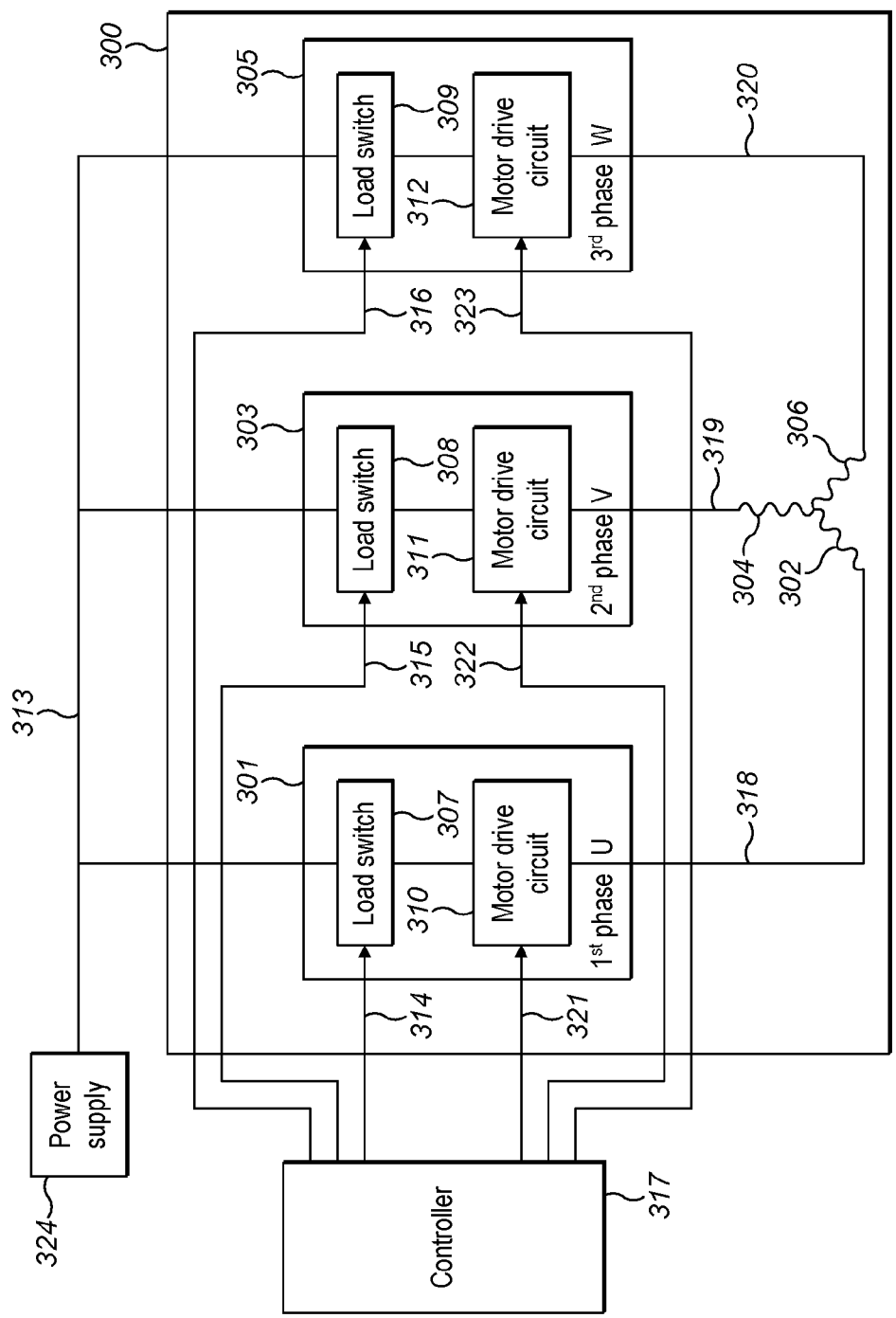
FIG. 3 illustrates a motor for driving a joint of a robot arm.

FIG. 3 illustrates an example motor 300 for driving a joint 205 of the robot arm 202. The motor 300 is a multiple-phase motor. The motor has a rotor and a stator and a plurality of windings mounted on one of the rotor and stator for acting on the other one of the rotor and stator. Each winding is connected at one end to the other windings, and at the other end to a motor phase. Current is driven sequentially through the windings causing the rotor to rotate relative to the stator, thereby generating a torque which can be used to drive a joint 205. In the example shown in FIG. 3, the motor is a three-phase motor, having: a first phase U 301 connected to a first winding U 302, a second phase V 303 connected to a second winding V 304, and a third phase W 305 connected to a third winding W 306. However, more generally, the motor may have more than three phases.

Each phase of the motor 301, 303, 305 comprises a load switch 307, 308, 309 and a motor drive circuit 310, 311, 312. The load switch connects power from the power supply rail 313 to the motor drive circuit of that phase in response to a control input 314, 315, 316 from joint controller 317. The motor drive circuit applies a drive signal 318, 319, 320 to the motor winding of that phase in response to control input 321, 322, 323. Power is supplied to power supply rail 313 from power supply 324.

Figure 4:
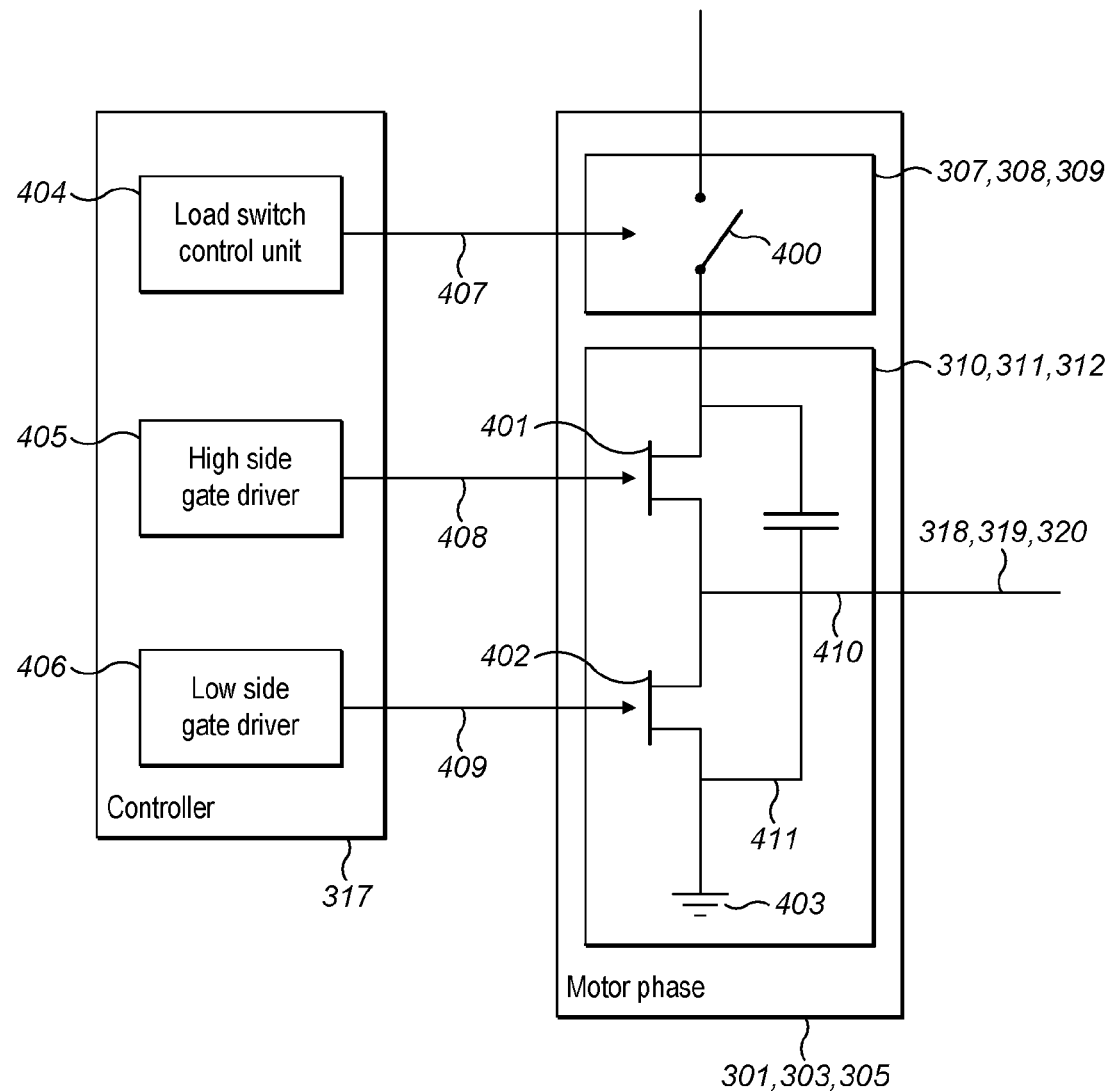
FIG. 4 illustrates an example structure of a phase of the motor of FIG. 3.

FIG. 4 illustrates an example structure of a motor phase 301, 303, 305 of FIG. 3. The load switch 307, 308, 309 comprises a switch 400 which may be implemented by a transistor. For example, the switch 400 may be implemented by a Field Effect Transistor (FET). The motor drive circuit 310, 311, 312 may comprise two transistors: a high side transistor 401 and a low side transistor 402. Each of the transistors 401, 402 may be implemented by a FET. The high side transistor 401 and low side transistor 402 are connected in series. The load switch 400, high side transistor 401, and low side transistor 402 are all connected in series, with the high side transistor 401 between the low side transistor 402 and the load switch 400. The other side of the load switch 400 is connected to the power supply rail 313. The other side of the low side transistor 402 is connected to ground 403. The drive signal 318, 319, 320 is output on drive signal line 410 which is connected between the high side transistor and the low side transistor. The motor drive circuit may additionally comprise a capacitor 411 connected in parallel with the high side transistor 401 and low side transistor 402. Specifically, the capacitor 411 is connected to one side of the high side transistor 401 and to the opposing side of the low side transistor 402. In other words, the capacitor 411 is connected between the switch 400 and high side transistor 401, and between the low side transistor 402 and ground 403. Capacitor 411 provides protection for the high side transistor and low side transistor in the event of a failure of the load switch which causes an over-current flowing into the motor drive circuit. In this scenario, the capacitor 411 prevents some of the current flowing through, and hence damaging, the high side transistor and low side transistor.

The joint controller 317 comprises a load switch control unit 404 for generating and outputting a control input 407 to the load switch 400. The control input 407 controls the load switch 400 to close, thereby connecting power through from the power supply rail to the motor drive circuit. The control input 407 also controls the load switch 400 to open, thereby disconnecting power from the power supply rail to the motor drive circuit. The joint controller 317 comprises a high side gate driver 405 for generating and outputting a high side gate input 408 to the high side transistor 401. The high side gate input 408 controls the high side transistor 401 to enable and disable current flow through it. The joint controller 317 comprises a low side gate driver 406 for generating and outputting a low side gate input 409 to the low side transistor 402. The low side gate input 409 controls the low side transistor 402 to enable and disable current flow through it.

The joint controller drives the gates of the high side transistor 401 and low side transistor 402 so as to generate a Pulse Width Modulation (PWM) drive signal on the drive signal line 410. Thus, in operation, the joint controller drives the motor by: controlling the load switch of the first motor phase U to close; and providing high and low side gate driver inputs to cause the motor drive circuit to generate a PWM drive signal for driving the first winding U. Then, the joint controller provides high and low side gate driver inputs to cause the motor drive circuit to discontinue generation of the PWM drive signal. The joint controller repeats this process sequentially with each of the other motor windings. Optionally, the joint controller may control the load switches of the motor phases which are not at that time generating the PWM drive signal to open. This prevents power being connected to the motor drive circuits of those phases.

Figure 5:
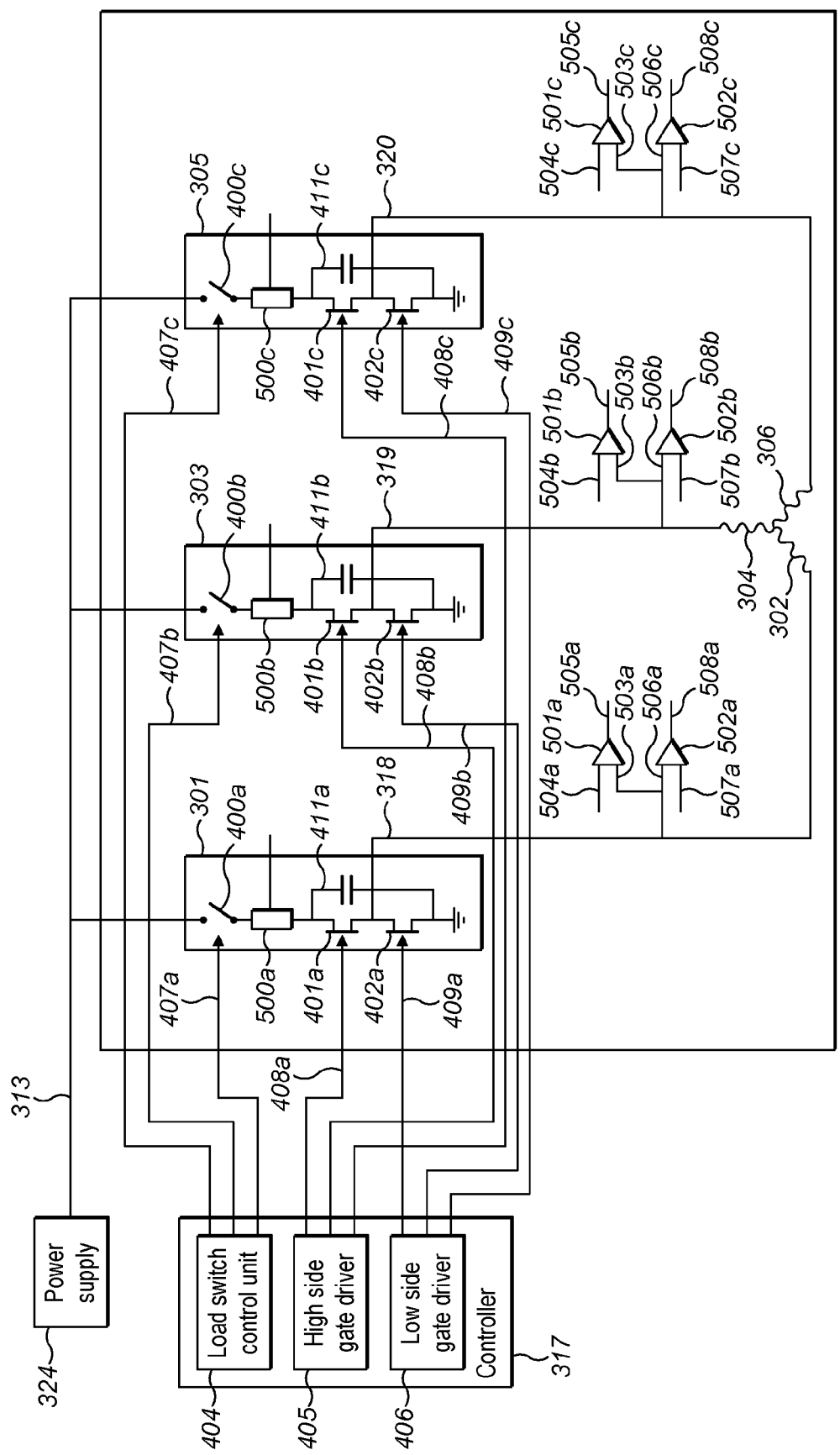
FIG. 5 illustrates sensors incorporated into a motor.

FIG. 5 illustrates an example three-phase motor as shown in FIG. 3, in which the joint controller 317 and each motor phase 301, 303, 305 has the structure shown in FIG. 4. The load switch control unit of the joint controller 317 provides control inputs 407a, 407b, 407c to the load switches 400a, 400b, 400c of each motor phase respectively. The high side gate driver 405 of the joint controller 317 provides high side gate inputs 408a, 408b, 408c to the high side transistors 401a, 401b, 401c of each motor phase respectively. The low side gate driver 406 of the joint controller 317 provides low side gate inputs 409a, 409b, 409c to the low side transistors 402a, 402b, 402c of each motor phase respectively.

The motor of FIG. 5 also comprises a plurality of sensors. Each motor phase comprises a current sensor 500a, 500b, 500c located between the load switch and motor drive circuit of that phase. The current sensor may, for example, be a current sense resistor. The current sensor has a current limit. The current limit may be predetermined. For example, the current limit may be 20 A. The current sensor output is connected to the joint controller 317 (not shown). The current sensor is configured to signal to the joint controller 317 if the current passing through the current sensor exceeds the current limit.

Each motor phase comprises sensor circuitry for detecting if the voltage of the drive signal to the motor winding is above a high threshold during a high pulse of the PWM signal, and below a low threshold during a low pulse of the PWM signal. Suitably, this circuitry detects the voltage towards the end of the pulse. For example, the voltage may be detected in the second half of the pulse. By this time, the voltage should have stabilised. FIG. 5 illustrates an example implementation of the sensor circuitry comprising two comparators. The circuitry is the same for each of the three motor phases. The circuitry for monitoring the first motor phase U will now be described.

The two comparators 501a, 502a each have as one input 503a, 506a the drive signal 318. The first comparator 501a has as its other input 504a the high threshold mentioned above. That high threshold may be, for example, a fraction of the supply voltage on the supply rail 313. That fraction may be a fraction between 0.8 and 0.99. That fraction may be a fraction between 0.9 and 0.95. The fraction may be 0.95. The first comparator compares the drive signal voltage to the high threshold. The output 505a of the first comparator indicates whether the drive signal voltage is above or below that high threshold. The second comparator 502a has as its other input 507a the low threshold mentioned above. That low threshold may be, for example, a fraction of the supply voltage on the supply rail 313. That fraction may be a fraction between 0.01 and 0.2. That fraction may be a fraction between 0.05 and 0.1. The fraction may be 0.05. The second comparator compares the drive signal voltage to the low threshold. The output 508a of the second comparator indicates whether the drive signal voltage is above or below that low threshold. The outputs of each of the comparators 501a, 502a are connected to the joint controller 317 (not shown). The comparators thereby signal to the joint controller whether the drive signal voltage is above or below the high threshold and low threshold.

Figure 6:
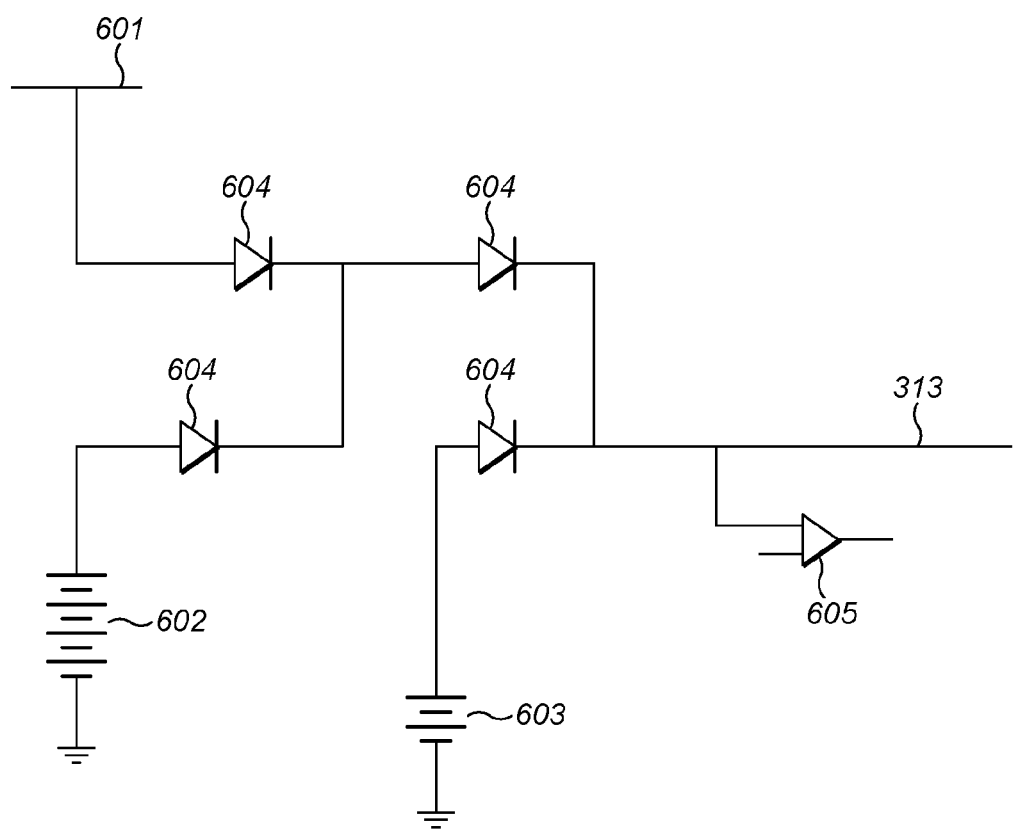
FIG. 6 illustrates an example structure of the power supply of FIG. 3.

FIG. 6 illustrates an example structure of the power supply 324 shown in FIGS. 3 and 5. The power supply 324 comprises a primary power supply 601. The primary power supply may be provided by a mains power supply. This may be routed to the robot arm via other components of the system. For example, in the case that the robot arm forms the slave component of a master-slave manipulator, and operates under the control of the master component located at a remote console, the primary power supply may be provided to the robot arm from the console.

The power supply 324 may also comprise a back-up power supply 602. The back-up power supply 602 has a different source to the primary power supply 601. That source may be in a different location to that of the primary power supply. That source may be connected to the power supply rail 313 via a different power line, for example a different cable, to the power line which connects the primary power supply 601 to the power supply rail 313. The back-up power supply may be a battery housed local to the robot arm. For example, the battery may be housed in the cart onto which the robot arm is mounted. Suitably, the back-up power supply is a rechargeable battery. The back-up power supply is controlled to supply power to the power supply rail 313 in the event that the primary power supply 601 fails. Suitably, the back-up power supply has sufficient energy stored to power manipulation of the robot arm to enable it to continue performing its intended operation for a predetermined period of time after the primary power supply fails. This predetermined period of time may be between 5 and 10 hours.

The power supply 324 may also comprise a further back-up power supply 603. The further back-up power supply 603 has a different source to the primary power supply 601 and the back-up power supply 602. That source may be in a different location to that of the primary and/or back-up power supplies. That source may be connected to the power supply rail 313 via a different power line, for example a different cable, to the power line(s) which connects the primary power supply 601 and back-up power supply 602 to the power supply rail 313. The further back-up power supply may be a battery housed in the cart or on the robot arm. The battery is significantly smaller than the rechargeable battery of the back-up power supply 602. The battery may be non-rechargeable. The further back-up power supply 603 is controlled to supply power to the power supply rail 313 in the event that the back-up power supply 602 fails. The further back-up power supply has sufficient energy stored to power manipulation of the robot arm for a very short period of time after the back-up power supply fails. This predetermined period of time may be 5 minutes or less. The predetermined period of time may be 30 seconds.

FIG. 6 illustrates several diodes 604, one between each power supply source and the power supply rail 313. These diodes 604 ensure that power is supplied in a uni-directional manner from the power supplies to the power supply rail 313, and that no current flows back into any of the power supplies from the power supply rail 313.

FIG. 6 also illustrates circuitry 605 for sensing the voltage supplied by the power supply 324. This circuitry includes a comparator 605 which has as its inputs the power supply rail 313 and a further input. That further input may be variable depending which power supply is active. For example, that further input may be a fraction of the expected supply voltage from the active power supply. That fraction may, for example, be 0.95. In this case, the output from the comparator 605 identifies whether the power supply rail is within 5% of its expected maximum supply voltage. The system may be driven at different voltages by the same power supply at different times during the testing process. The further input may be variable dependent on the voltage that the system is being driven by at that time. The output of the comparator may be input to the joint controller 317.

The following describes testing the motor arrangement described herein for a fault during a start-up procedure of the robot arm. The test procedure is performed internally by the robot arm, and hence may be referred to as a Power On Self Test (POST). Suitably, the joint controller passes sensory data received from the motor to a fault controller. The fault controller may be a centralised controller located external to the robot arm which receives sensory data from each individual joint controller of the robot arm. The fault controller controls the joint controllers to implement the POST, and on detecting a fault, the fault controller controls the joint controllers to implement a response to the fault detection as described below.

Figure 7:
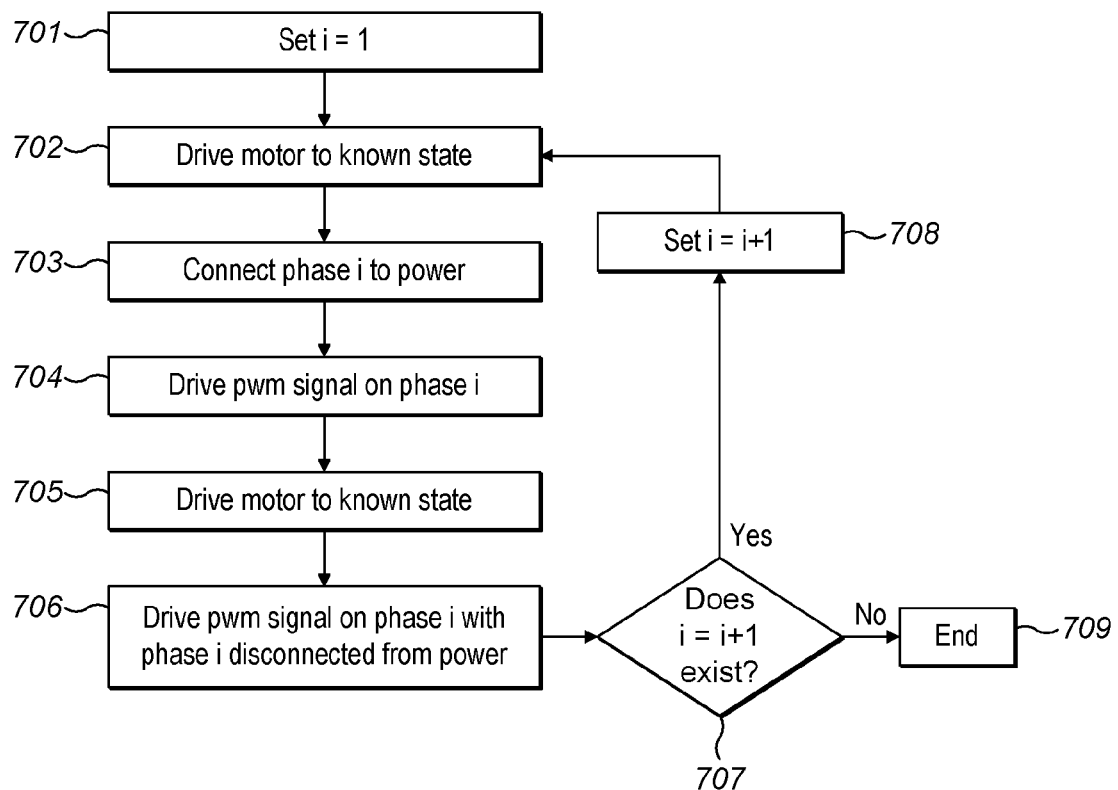
FIG. 7 is a flowchart illustrating a start-up procedure for a joint motor.

FIG. 7 illustrates an exemplary POST sequence for testing a joint motor of the robot arm during start-up. At step 701, the motor phase being tested is set to the first motor phase, i.e. i=1. In the motor of FIG. 3, this is motor phase U. At the next step 702, the motor is driven to a known state. Suitably, this known state is one in which the motor voltage is known. For example, the known state may be that in which the voltage across each winding of the multiple-phase motor is zero. In the three-phase motor described herein, this may be achieved by the joint controller 317 controlling the load switch 307, 308, 309 of each motor phase to open via control inputs 407a, 407b, 407c. Additionally, the joint controller may control the low side transistor of each motor phase to enable current to flow through it via low side gate inputs 409a, 409b, 409c. These two actions together cause the motor to enter a "passive brake" state in which the motor windings do not generate a torque to drive the joint.

At the next step 703, the first motor phase U is connected to power. Suitably, this is implemented by the joint controller 317 controlling the load switch 400a of the first phase to close so as to connect power from the power supply rail 313 to the motor drive circuit 310 of the first motor phase U. Whilst the joint controller 317 controls the load switch 400a to close, it controls the load switches 400b, 400c of the other motor phases to remain open. Suitably, during this time, the joint controller continues to control the low side transistors of all the motor phases to remain ON.

At the next step 704, a PWM signal is driven through the motor drive circuit 310 of the first motor phase U. Suitably, this is implemented by the joint controller 317 applying gate drive inputs 408a, 409a to the high and low side transistors 401a, 402a in a PWM sequence, as described above. A PWM drive signal 318 is thereby generated and output from the motor drive circuit 310 to the first phase winding U 302. During this time, the joint controller continues to control the load switch 400a of the first motor phase U closed and the load switches 400b, 400c of the other motor phases V,W open.

At the next step 705, the motor is driven to a known state. Suitably, this is implemented in the same way as described with respect to step 702. The known state of the motor in step 705 may be the same as the known state of the motor in step 702. The known state of the motor in step 705 may be different to the known state of the motor in step 702. Thus, the joint controller controls the load switches 400a, 400b, 400c of all the motor phases to open. The joint controller may also control the low side transistor of each motor phase to an ON state.

At the next step 706, a PWM signal is driven through the motor drive circuit 310 of the first motor phase U. At this time, the load switch 400a of the first motor phase U is open, and hence the first motor phase U is disconnected from the power supply rail 313. The joint controller 317 applies gate drive inputs 408a, 409a to the high and low side transistors 401a, 402a in a PWM sequence, as for step 704. During this time, the joint controller continues to control the load switches 400b, 400c of the other motor phases V,W open. If the motor drive circuit comprises optional capacitor 411a, opening the load switch 400a and applying the PWM sequence causes the capacitor 411a to discharge.

At the next step 707, it is determined if there is a motor phase after the current motor phase. In other words does i=i+1 exist? For the motor described herein, a second motor phase exists. Thus, the answer to the question at step 707 is YES, and the method proceeds to step 708, where i is set to i+1. In other words, i is set to 2. Steps 702 to 706 then repeat in respect of the second motor phase V. On reaching step 707 in this iteration, a third motor phase exists. Thus, the answer to the question at step 707 is YES, and the method proceeds to step 708, where i is set to i+1. In other words, i is set to 3. Steps 702 to 706 then repeat in respect of the third motor phase W. On reaching step 707 in this iteration, the answer to the question is NO for a three-phase motor. Thus, the process moves to step 709, where the sequence ENDS. In a multiple-phase motor with more than three motor phases, further iterations of the flowchart of FIG. 7 would be completed, one for each motor phase.

Each step of the flowchart of FIG. 7 may be carried out for a predetermined duration before moving on to the next step. The steps of FIG. 7 are carried out in the order shown.

Whilst the sequence of FIG. 7 is being undertaken, sensory data from the motor is fed back to the fault controller for testing whether the motor is operating as expected. Suitably, the following described tests are carried out during every step of the flowchart shown in FIG. 7.

Firstly, the fault controller may test whether, for each motor phase, current from the power supply rail to the motor drive circuit exceeds a current limit. For example, the fault controller may use the output of the current sensor 500a, 500b, 500c of each motor phase to determine whether the current passing through the current sensor exceeds the current limit. The current limit may be predetermined. Alternatively, the current limit of the current sensor may be reconfigurable. For example, the current limit may be set in real time to a value close to the expected current supplied from the power supply rail. Thus, if the expected supplied current changes, the current limit of the current sensor is reconfigured accordingly. Suitably, the current limit is set to the maximum expected supplied current. The fault controller detects a fault on receiving an indication from the current sensor that the current limit has been exceeded.

Secondly, the fault controller may test whether, for each motor phase, the voltage supplied to the motor winding of that motor phase differs from each of the power supply rail voltage and ground by more than respective amounts. For example, whilst the first motor phase is being driven in the PWM mode in step 704 of FIG. 7, the fault controller may use the output of the comparators 501a and 502a to determine whether the voltage supplied to the first winding exceeds the high threshold during a high pulse of the PWM signal and/or whether the voltage supplied to the first winding is lower than the low threshold of a low pulse of the PWM signal. The fault controller performs the same process with the other motor phases when they are being driven in the PWM mode in step 704 of FIG. 7. The fault controller detects a fault if the voltage supplied to the winding is below the high threshold. The fault controller detects a fault if the voltage supplied to the winding is above the low threshold.

Whilst the first motor phase is being driven in the PWM mode in step 706 of FIG. 7, the fault controller may use the output of the comparator 501a to determine whether the voltage supplied to the first winding exceeds the high threshold during a high pulse of the PWM signal. The fault controller performs the same process with the other motor phases when they are being driven in the PWM mode in step 706 of FIG. 7. The fault controller detects a fault if the voltage supplied to the winding is above the high threshold.

The high and low thresholds of the comparators 501a, 501b, 501c and 502a, 502b, 502c are a proportion of the supply voltage. This proportion may be pre-set. Alternatively, this proportion may be configurable in real time.

Thirdly, the fault controller may test whether the voltage supplied to the motor is lower than a threshold voltage value. For example, the fault controller may use the output of comparator 605 to determine whether the voltage supplied to the power supply rail 313 at time t is lower than a threshold voltage value at time t. That threshold voltage value may be reconfigurable dependent on which power supply is supplying power to the power supply rail 313. For example, the threshold voltage value may be a fraction of the expected supply voltage from that active power supply. The fault controller detects a fault if the output of comparator 605 indicates that the voltage supplied is lower than the threshold voltage value.

The fault controller may also identify the source of the fault in dependence on the sensory output from the motor, as follows:

(i) The fault controller detects a fault with the high side transistor of a motor phase if the voltage supplied to the winding in that motor phase is below the high threshold of comparator 501 during the PWM mode of step 704 of FIG. 7. For example, the fault may be that the high side transistor has failed short or is open.

(ii) The fault controller detects a fault with the low side transistor of a motor phase if the voltage supplied to the winding in that motor phase is above the low threshold of comparator 502 during the PWM mode of step 704 of FIG. 7. For example, the fault may be that the low side transistor has failed short or is open.

(iii) The fault controller detects a fault with the load switch of a motor phase if, after a predetermined period of driving the PWM mode in step 706 of FIG. 7, the voltage supplied to the winding is above the high threshold of comparator 501. For example, the fault may be that the load switch has failed short.

(iv) The fault controller detects a fault with the load switch of a motor phase and/or a fault with the high side transistor of that motor phase and/or a fault with the low side transistor of that motor phase on receiving an indication from the current sensor 500 that the current limit has been exceeded.

(v) The fault controller detects a fault with a power supply on receiving an indication from the comparator 605 that the voltage from the power supply has dropped below the threshold voltage value for time t for that power supply.

The fault controller may identify other sources of the fault, dependent on the combination of sensory outputs from the motor. For example, it may identify that a motor winding is open, or that one of the high or low side comparators is not functioning properly.

During each fault assessment, the fault controller may assess the outputs of all the sensory data and state information it receives from the motor, and following this assessment detect zero, one or more of the fault conditions listed above.

For each step of the flowchart of FIG. 7, if that step is carried out for its predetermined duration and no fault is detected by means of the testing described above, then the process continues to the next step. However, if during a step, a fault is detected, the process may enter a FAULT state.

On having entered the FAULT state, the joint controller responds by electrically braking the motor. To do this, it applies a braking current to the motor so as to maintain the position of the joint that the motor drives against gravity. The joint is held in one configuration, and thus prevents the links of the robot arm that the joint connects from drooping under gravity. If the joint is a revolute joint, then the braking current provides a fixed torque to the joint which is such as to lock the rotational position of the joint. The value of the fixed torque depends on the pose of the arm. In other words, the fixed torque to be applied to a joint to lock its rotational position has one value in one configuration of the robot arm, and another value in a different configuration of the robot arm. Thus the value of the fixed torque, and hence the value of the braking current depends on the position which the joint is to be held in, and may be controlled by the joint controller accordingly.

The fixed torque is sufficient to hold the rotational position of the joint against gravity. If at the time that the FAULT state is entered, the joint is moving below a threshold speed, the fixed torque is sufficient to halt movement of the joint in time T and hold the joint in that halted position against gravity. If, however, at the time that the FAULT state is entered, the joint is moving above the threshold speed, then the fixed torque is not sufficient to halt movement of the joint in time T. In this case, the joint controller electrically brakes the motor by applying a braking current that provides an initial torque, which has a higher value than the fixed torque. This initial torque is sufficient to halt movement of the joint in time T. Once the joint is halted, the joint controller then electrically brakes the motor by applying the fixed torque to hold the joint in the halted position against gravity.

The braking current requires power, thus the electrical brake requires power to hold the joint in position. The electrical brake is applied by the same motor that drives the articulation of the joint, under the control of the same joint controller. No separate entity is involved in the electrical braking.

The joint controller may electrically brake the motor by applying a braking current to all phases of the motor. For example, the joint controller may implement this by controlling: (i) the load switch of each motor phase to be closed so as to connect power from the power supply rail 313 to the motor drive circuit of that phase, and (ii) the motor drive circuit of each motor phase to connect the braking current through to the motor winding of that phase.

If the fault controller has identified the source of the fault as being located in one of the motor phases, then the joint controller responds by opening the load switch of that motor phase so as to isolate the motor winding of that single phase from the motor, and applying the braking current only to the other phases of the motor. For example, if the fault controller has identified that there is a fault with the first motor phase U, then the joint controller controls: (i) load switch 307 of the first motor phase to open, (ii) load switch 308 of the second motor phase to close, and (iii) load switch 309 of the third motor phase to open. In this way, it applies a braking current between the second and third motor phases, thereby holding the joint in its current configuration.

During the fault state, the joint controller continues to receive sensory data from the sensors described above.

Figure 8:
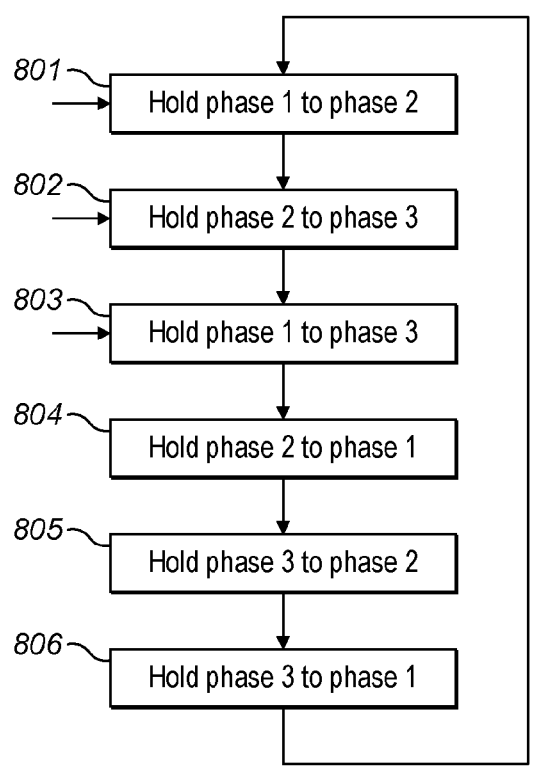
FIG. 8 illustrates a set of holding states following a fault detection.

FIG. 8 illustrates a set of holding states, each of which applies a braking current to the motor via different components. The joint controller may control the motor to cycle through the set of holding states in the following circumstances:

(i) If the source of the fault has not been identified;
(ii) If multiple faults are detected;
(iii) If, following applying a braking current to all phases of the motor, sensory data received by the fault controller causes the fault controller to continue to detect a fault; or
(iv) If following applying a braking current to two phases of the motor, sensory data received by the fault controller causes the fault controller to continue to detect a fault.

FIG. 8 illustrates six holding states, each of which applies a braking current between two phases of the motor. State 801 applies a braking current between the first and second phases of the motor, from the first phase to the second phase. State 802 applies a braking current between the second and third phases of the motor, from the second phase to the third phase. State 803 applies a braking current between the first and third phases of the motor, from the first phase to the third phase. State 804 applies a braking current between the second and first phases of the motor, from the second phase to the first phase. State 805 applies a braking current between the third and second phases of the motor, from the third phase to the second phase. State 806 applies a braking current between the third and first phases of the motor, from the third phase to the first phase.

Generally speaking, to apply a braking current from phase X to phase Y, the load switch of phase X is closed so as to enable current to flow from the power supply rail 313 to the motor drive circuit of that phase, and the load switch of phase Y is open. Additionally, the low side transistor of phase Y is driven to ground by the low side gate driver. The high side transistor of phase Y is open. The load switch of the other phase Z is open. The low side transistor of phase Z is floating, i.e. not connected to the power supply rail or to ground. The high side transistor of phase Z is open.

The joint controller controls the motor to cycle through the set of holding states, from state 801 to state 802 to state 803 to state 804 to state 805 to state 806, and back to state 801 and so on. If the source of the fault has not been identified, multiple faults are detected, or a fault has been detected when a braking current is applied to all phases of the motor, then the joint controller may control the motor to initially apply a braking current in any of the holding states shown in FIG. 8. For example, the joint controller may control the motor to start at state 801. If a fault has been identified in a single motor phase, then the joint controller controls the motor to initially apply a braking current in a holding state that excludes that motor phase. For example, if a fault has been detected in the first motor phase, then the joint controller may control the motor to initially enter holding state 802 or 805, neither of which applies a holding current between the first phase and another phase. The joint controller may control the motor to always enter the same holding state in this situation, for example always state 802.

The joint controller controls the motor to apply a braking current in a holding state of FIG. 8 for a predetermined time. If after this predetermined time, a fault condition is no longer detected, then the joint controller controls the motor to maintain the braking current in this holding state. If after the predetermined time, a fault condition continues to be detected, then the joint controller controls the motor to move to apply a braking current in the next holding state in the cycle. The process continues cycling through the states in FIG. 8, each time applying a braking current in the holding state for a predetermined time before moving to the next state if a fault continues to be detected.

It is to be understood that FIG. 8 illustrates one example cycle order of states. The cycle order may be different to that shown in FIG. 8. The cycle order may be the set of states 801-806 in any order.

Generally, the joint controller is configured to electrically brake the motor by controlling power to be supplied to the motor 300 from the primary power supply 601. If the detected fault is a loss of power, the joint controller may initially control the braking current to be supplied to the motor 300 from the primary power supply 601. If the fault controller continues to receive sensory data causing it to detect a loss of power, then it causes the joint controller to disconnect the primary power supply 601 from the power supply rail 313, and instead connect back-up power supply 602 to the power supply rail 313 for providing the braking current to the motor. If the fault controller continues to receive sensory data causing it to detect a loss of power, then it causes the joint controller to disconnect the back-up power supply 602 from the power supply rail 313, and instead connect further back-up power supply 603 to the power supply rail 313 for providing the braking current to the motor.

Alternatively, the fault controller may, in response to its initial detection of a loss of power, cause the joint controller to control the braking current to be supplied to the motor from the back-up power supply 602. If the fault controller continues to receive sensory data causing it to detect a loss of power, then it causes the joint controller to disconnect the back-up power supply 602 from power supply rail 313, and instead connect further back-up power supply 603 to the power supply rail 313 for providing the braking current to the motor.

The POST process described with reference to FIG. 7 is usefully carried out on each motor driving a joint of the robot arm. However, the fault controller may only control the joint controllers of some of the joints to apply the electrical brake to their motors. Those joints may be those which are in such a configuration that they could cause the arm to droop under gravity if they are not actively driven. Those joints may be those which are back-driveable.

The fault controller may cause the whole robot arm to enter a FAULT state on detecting a single fault with a single joint motor of the robot arm. In other words, the fault controller may cause the whole robot arm to freeze its configuration, thereby holding the whole robot arm in position against gravity, in response to detecting a fault in a motor of the robot arm. Thus, the fault controller may cause a joint controller to apply a braking current to a motor which itself is not faulty, but as a result of a fault being detected in another motor in the robot arm.

On entering a fault state, the fault controller issues one or more alert signal. This may be any one or combination of the following: an audible signal such as an alarm; a visual signal displayed on the robot arm and/or its base and/or the display of an operator of the robot arm; and a haptic signal which an operator of the robot arm can feel through the hand controllers for operating the robot arm. A different alarm may be generated in the event that the further back-up power supply is controlled to supply power to the power supply rail.

If the joint motors of the robot arm successfully pass the POST procedure, then the robot arm may continue into normal use. During normal operation of the robot arm, the fault controller may continue to monitor for some faults in the joint motors. Suitably, only a subset of the faults monitored for during the POST process are monitored for during normal use of the robot arm. The fault controller may continue to test:
  (i) For faults in the load switches 307, 308, 309 of the motor phases. This is implemented by receiving sensory data from the current sensors 500a, 500b, 500c. That sensory data indicates when the current flowing through the load switch to the motor drive circuit of a motor phase exceeds the current limit of the current sensor. The fault controller detects a fault if the current limit is exceeded.
  (ii) For faults in the power supply. This is implemented by receiving sensor data from comparator 605. That sensory data indicates when the supply voltage drops below a threshold voltage. The fault controller detects a fault if the supply voltage drops below the threshold voltage.

The fault controller responds to detection of a fault during normal operation as described above, by entering a FAULT state and electrically braking the motor.

The apparatus and methods described herein enable the joint motor to be protected against a single point of failure in the motor, for example a failure of a single motor winding or a single transistor failure, by isolating the motor phase with the fault and applying a braking current between the other phases of the motor. The motor phase with the fault is isolated by opening the load switch. Opening the load switch also isolates the power source from the motor phase, which is useful in the event that the fault is a short circuit in the motor phase.

The motor described herein usefully provides circuitry, via the load switch, to disconnect each motor phase independently from the power supply rail. This circuitry is independent of the circuitry (for example transistors) of the motor drive circuit used to generate the motor drive signal.

Suitably, the methods described herein are performed asynchronously. In other words, they are not reliant on a system clock. Thus, the fault detection and response can be performed even if the system clock fails.

The methods and apparatus described herein discuss some functions as being controlled by a joint controller and others as being controlled by a fault controller. It will be understood that the functions described herein may be differently distributed between the joint and fault controllers. The functions may be distributed between more controllers than the joint and fault controllers. A single controller may perform all the described functions. Each controller comprises a processor for executing instructions to carry out the methods described herein. The instructions are computer executable, and can be provided using any computer-readable media such as a memory. The methods described herein may be performed by software in machine readable form on a tangible storage medium. Software can be provided at the a computing-based device to implement the methods described herein.

References made to sensing and testing currents may instead be implemented by sensing and testing voltages, in accordance with methods known by the skilled person. Similarly, references made to sensing and testing voltages may instead be implemented by sensing and testing currents, in accordance with methods known by the skilled person.

The robot described herein may be a surgical robot having a surgical instrument attachment with a surgical end effector. Alternatively, the robot could be an industrial robot or a robot for another function. The instrument could be an industrial tool.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method of testing a motor of a robot arm for a fault during a start-up procedure of the robot arm, the robot arm comprising a first link connected to a second link by a joint, the joint permitting the second link to move relative to the first link, the motor configured to drive the joint, the motor being a multiple-phase motor, each phase of the motor comprising a motor winding and a motor drive circuit configured to apply power to the motor winding from a power supply rail and to apply drive signals to the motor winding, the method comprising, in the following order:
  (i) driving the motor to a known state;
  (ii) connecting a first phase only of the motor to the power supply rail;

(iii) driving a Pulse Width Modulation (PWM) signal through the motor drive circuit of the first phase of the motor;

(iv) driving the motor to a known state;

(v) with the first phase of the motor disconnected from the power supply rail, driving the PWM signal through the motor drive circuit of the first phase of the motor; and (vi) repeating steps (ii) to (v) for each of the other phases of the motor;

the method further comprising, during each of steps (i) to (vi), testing whether the current from the power supply rail to the motor drive circuit exceeds a current limit.

2. A method as claimed in claim 1, further comprising during each of steps (i) to (vi), testing whether the voltage supplied to the motor winding of the first phase of the motor differs from each of the power supply rail voltage and ground by more than respective values.

3. A method as claimed in claim 2, wherein the testing step of claim 2 comprises comparing the voltage supplied to the winding to a high threshold during a high pulse of the PWM signal, and comparing the voltage supplied to the winding to a low threshold during a low pulse of the PWM signal.

4. A method as claimed in claim 3, comprising detecting a fault if the voltage supplied to the winding is below the high threshold and/or detecting a fault if the voltage supplied to the winding is above the low threshold.

5. A method as claimed in claim 4, wherein each motor drive circuit comprises a high side transistor and a low side transistor configured to drive the PWM signal to the motor winding of that phase, the method comprising detecting a fault with the high side transistor if the voltage supplied to the winding is below the high threshold and/or detecting a fault with the low side transistor if the voltage supplied to the winding is above the low threshold.

6. A method as claimed in claim 4, wherein for each phase of the motor, the motor comprises a load switch configured to connect the power supply rail to the motor drive circuit of that phase, the method comprises detecting a fault with the load switch of the first phase if, after a predetermined period of driving the PWM signal at step (v) of claim 1, the voltage supplied to the winding is above the high threshold.

7. A method as claimed in claim 4, comprising in response to detecting the fault, applying a braking current to the motor so as to maintain the position of the joint against gravity.

8. A method as claimed in claim 7, comprising applying the braking current between a first pair of phases of the motor only, from the first phase of the first pair to the second phase of the first pair.

9. A method as claimed in claim 8, further comprising if a fault continues to be detected after a predetermined time period, applying a braking current between a second pair of phases of the motor only, from the first phase of the second pair to the second phase of the second pair.

10. A method as claimed in claim 9, further comprising if a fault continues to be detected after a predetermined time period, applying a braking current between a third pair of phases of the motor only, from the first phase of the third pair to the second phase of the third pair.

11. A method as claimed in claim 10, further comprising if a fault continues to be detected after a predetermined time period, applying a braking current between the first pair of phases of the motor only, from the second phase of the first pair to the first phase of the first pair.

12. A method as claimed in claim 11, further comprising if a fault continues to be detected after a predetermined time period, applying a braking current between the second pair of phases of the motor only, from the second phase of the second pair to the first phase of the second pair.

13. A method as claimed in claim 12, further comprising if a fault continues to be detected after a predetermined time period, applying a braking current between the third pair of phases of the motor only, from the second phase of the third pair to the first phase of the third pair.

14. A method as claimed in claim 1, wherein for each phase of the motor, the motor comprises a load switch configured to connect the power supply rail to the motor drive circuit of that phase, and each motor drive circuit comprises a high side transistor and a low side transistor configured to drive the PWM signal to the motor winding of that phase, wherein step (i) and/or (iv) comprises opening the load switch of every phase of the motor and turning on the low side transistor of every phase of the motor.

15. A method as claimed in claim 1, wherein for each phase of the motor, the motor comprises a load switch configured to connect the power supply rail to the motor drive circuit of that phase, wherein step (ii) comprises closing the load switch of the first phase of the motor with the load switches of all the other phases of the motor being open.

16. A method as claimed in claim 1, wherein for each phase of the motor, the motor comprises a load switch configured to connect the power supply rail to the motor drive circuit of that phase, wherein step (v) comprises with all load switches of every phase of the motor being open, driving the PWM signal through the motor drive circuit of the first phase of the motor.

17. A method as claimed in claim 1, wherein for each phase of the motor, the motor comprises a load switch configured to connect the power supply rail to the motor drive circuit of that phase, and a current sensor between the load switch and the motor drive circuit, the method comprising detecting a fault in response to sensing at the current sensor that the current from the power supply rail to the motor drive circuit exceeds a current limit.

18. A method as claimed in claim 17, wherein each motor drive circuit comprises a high side transistor and a low side transistor configured to drive the PWM signal to the motor winding of that phase, the method comprising detecting a fault with the load switch of the first phase and/or the high side transistor and/or the low side transistor on sensing that the current from the power supply rail to the motor drive circuit exceeds a current limit.

19. A method as claimed in claim 1, wherein power is applied to the power supply rail from one of a plurality of power supplies, the method comprising:

comparing the voltage supplied at a time t to a threshold voltage value for the time t; and detecting a fault if the supplied voltage at the time t is lower than the threshold voltage value for the time t.

20. A method as claimed in claim 19, comprising detecting a fault with a power supply on sensing that the voltage from that power supply at time t drops below the threshold voltage value for the time t.

* * * * *